United States Patent [19]

Frigerio et al.

[11] Patent Number: 5,086,299
[45] Date of Patent: Feb. 4, 1992

[54] HIGH SPEED ANALOG-TO-DIGITAL CONVERTER HAVING A PLURALITY OF COMPARISON CELLS WHICH IN SUCCESSIVE STEPS DETERMINE THE FOUR MOST SIGNIFICANT BITS OF THE CONVERSION AND THEN THE FOUR LEAST SIGNIFICANT BITS

[75] Inventors: Giulio Frigerio, Cavenago Brianza; Alessandro Cremonesi, S. Angelo Lodiginao, both of Italy

[73] Assignee: SGS-Thomson Microelectronics s.r.l., Agrate Brianza, Italy

[21] Appl. No.: 520,724

[22] Filed: May 9, 1990

[30] Foreign Application Priority Data

May 17, 1989 [IT] Italy ............................ 20537 A/89

[51] Int. Cl.⁵ .................................... H03M 1/14
[52] U.S. Cl. .................................... 341/156; 341/172
[58] Field of Search ............... 341/156, 159, 161, 172

[56] References Cited

U.S. PATENT DOCUMENTS

| | | | |
|---|---|---|---|
| 4,051,469 | 9/1977 | Ninomiya | 341/110 |
| 4,760,376 | 7/1988 | Kobayashi et al. | 341/172 |
| 4,764,753 | 8/1988 | Yukawa | 341/172 |
| 4,851,846 | 7/1989 | Haulin | 341/172 |
| 4,890,107 | 12/1989 | Pearce | 341/156 |
| 4,918,449 | 4/1990 | Chin | 341/156 |
| 4,973,974 | 11/1990 | Suzuki | 341/118 |
| 4,973,976 | 11/1990 | Lee et al. | 341/141 |

Primary Examiner—A. D. Pellinen
Assistant Examiner—Marc S. Hoff
Attorney, Agent, or Firm—Sixbey, Friedman, Leedom & Ferguson

[57] ABSTRACT

A high conversion speed analog-to-digital converter is constituted by a plurality of comparison cells which in successive steps determine first the four most significant bits of the analog-to-digital conversion and then the least significant bits of the same, having first accomplished the reconversion of the four most significant bits to analog and their subsequent subtraction from the input signal.

2 Claims, 1 Drawing Sheet

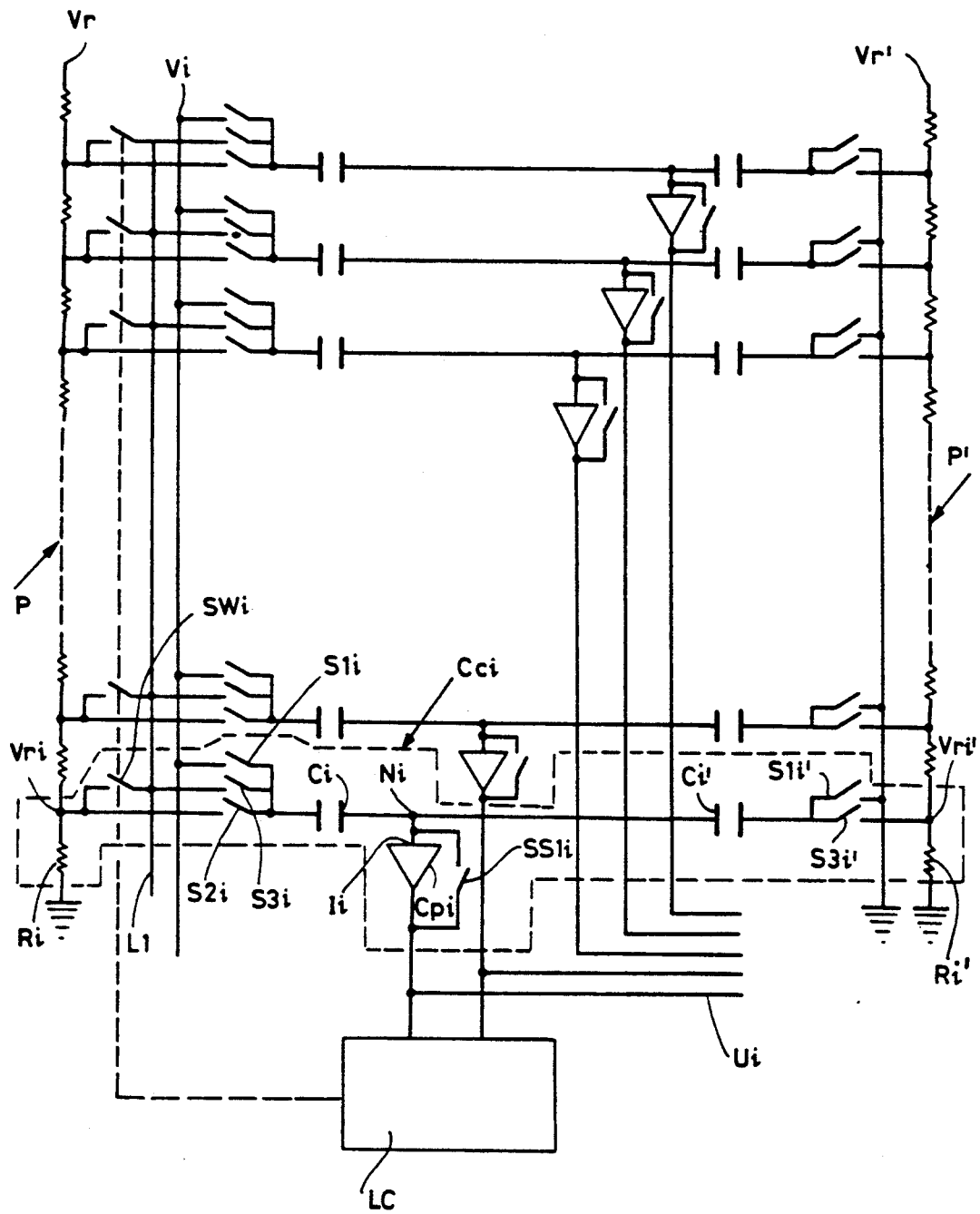

HIGH SPEED ANALOG-TO-DIGITAL CONVERTER HAVING A PLURALITY OF COMPARISON CELLS WHICH IN SUCCESSIVE STEPS DETERMINE THE FOUR MOST SIGNIFICANT BITS OF THE CONVERSION AND THEN THE FOUR LEAST SIGNIFICANT BITS

DESCRIPTION

The present invention relates to a high speed analog-to-digital converter.

Recent developments in the field of digital techniques for the processing of signals have increased interest for high speed conversion.

In particular the processing of signals in the video band creates the need of converters with a band width 10–50 Mhz and dynamic field of 8 bits.

An integrated approach for a digitization system requires the implementation, inside the conversion device itself, of several preprocessing functions.

In such sector the use is known of flash (or instantaneous) converters having one or two steps. In particular a single-step flash converter allows the use of conversion speeds of 120 Ms/sec (Megasamples per second) with bipolar technology and of 20 Ms/sec with CMOS technology. This approach does, however, have some drawbacks in terms of dissipated power, silicon area, high capacitative load at input.

Such drawbacks are overcome in part by using flash converters having two conversion steps. In this case the conversion operation provides for a first step of rough conversion of the sampled input signal, whereby there are obtained the four most significant bits of the signal at output, and a second step which receives at input a signal equal to the difference between the sampled input signal and the output signal of the first conversion step, reconverted to analog, and operates a fine conversion completing the digital output signal with the four least significant bits.

The use of such two-step conversion devices unfortunately requires conversion times which are longer with respect to the use of single-step converters. It is in fact necessary to execute two successive flash conversions, reconvert to analog the result of the first conversion operation and execute a subtraction before the second fine conversion step.

The object of the present invention is thus to accomplish an analog-to-digital converter with a very high conversion speed, around 50 Ms/sec in the CMOS technology, which has low input capacitance, low power dissipation and optimization of the silicon area used.

According to the invention such object is accomplished by means of a converter, characterized in that it comprises a plurality of comparison cells which in successive steps determine the four most significant bits of the conversion and then the four least significant bits after the more significant bits have been reconverted to analog and their subsequent subtraction from the input signal.

In particular each of said comparison cells is constituted by a comparator with the input connected to an intermediate branch point between two condensers in series, one of which is supplied in a first step with an input signal, in a second step with a first reference voltage different for each cell and in a third step with a selected reference voltage equal to that of said first reference voltages which approximates said input signal downwards with the highest accuracy, and by a second condenser which is grounded during said first and second steps, while during the third step it is connected to one respective of a plurality of second reference voltages submultiples of said first reference voltage.

In this way the result is obtained that a single group of comparators accomplishes both analog-to-digital conversion operations, the operation of intermediate digital-to-analog reconversion of the output signal from the first step of analog-to-digital conversion and that of subtraction of said signal reconverted to analog from the input signal, which in normal two-step flash converters are accomplished by two groups of comparators with a digital-to-analog converter and subtractor connected in between. There follow favourable results especially in terms of the speed of conversion, of the use of the silicon area and of power dissipation.

These and other features of the present invention shall be made evident by the following detailed description of an embodiment illustrated as an example in the enclosed drawing.

BRIEF DESCRIPTION OF THE DRAWINGS

The FIGURE is a schematic diagram of the preferred embodiment of the present invention.

In detail, the converter comprises a plurality of comparison cells, in particular 15 in the case comparison is required to be executed in the 8-bit range. The generic comparison cell $Cc_i$ comprises a comparator $Cp_i$, of the type with one input only and with a digital output whose value depends on the variations of the input voltage, whose input is connected to an intermediate branch point $N_i$ between two series condensers $C_i$ and $C_i'$, respectively.

The condenser $C_i$ is in turn connected, on one side, to the branch point $N_i$ and on the other side it communicates with a parallel of three different switches $S1_i$, $S2_i$, $S3_i$, respectively, which are closed in temporal succession. In particular the switch $S1_i$ connects condenser $C_i$ to an input voltage $V_i$, the switch $S2_i$ connects the condenser $C_i$ to a reference voltage $Vr_i$ forming part of a voltage divider P constituted by a series of resistances $R_i$, in the specific case 16, of equal value connected between a terminal supplying a voltage $V_r$ and ground, and switch $S3_i$ connects condenser $C_i$ to a supply line $L1$ which, by means of switch $SW_i$, is connected to that among the different reference voltages $Vr_i$ which is in turn selected by a coding logic LC sensitive to the outputs of comparators $Cp_i$ as that which approximates the input voltage $V_i$ downwards with the highest accuracy.

Condenser $C_i'$ is in turn connected, on one side, to the branch point $N_i$, and on the other side communicates with a parallel of two switches, $S1_i'$, $S3_i'$, respectively, of which $S1_i'$ grounds said condenser $C1$ and $S3_i'$ connects said condenser $C_i'$ to a reference voltage $Vr_i'$ forming part of a voltage divider $P'$ constituted by a series of resistances $R_i'$, in the specific case 16, of equal value connected between a terminal supplying a voltage $Vr'$, where $Vr' = Vr/16$, and ground.

The input $I_i$ of each comparator is also connected to the respective output $U_i$ by means of a switch $SS1_i$.

Due to the described structure the analog-to-digital converter operates as follows.

During a first step, switches $S1_i$ are closed and the value of the input voltage $V_i$ is, memorized in condensers $C_i$. Switches $SS1_i$ also are closed to allow automatic cancellation of the offset at the terminals of comparator $Cp_i$. During this step, condensers $C_i'$ are grounded through switches S1i', closed simultaneously with switches S1i.

During a second step, switches S1i, S1i' and SS1i are open and switches S2i are closed so that the left-hand armature of the generic condenser Ci is brought to a respective reference voltage Vri. As a consequence while condenser Ci still memorizes the input voltage Vi, the voltage at the branch point Ni changes to a value (Vr - Vi) which according to the sign (+ or −) translates to a logic level 0 or 1 on the generic output Vi of comparator Cpi. There is thus operated a rough conversion of the input signal obtaining the 4 most significant bits of the digitalized signal Vi.

During a third step with switches S2i returned in open condition the coding logic LC, having detected the logic levels at the outputs of comparators Cpi, commands the closing of a selected switch SWi corresponding to the reference voltage Vri which best approximates the value of the four most significant bits of the input voltage Vi downwards thereby carrying out a reconversion of said four most significant bits into a corresponding analog signal. Switches S3i and S3i' are then closed to connect the condensers Ci to the selected reference voltage (Vrix) and condensers Ci' to respective reference voltage Vri'. As a consequence, the branch point Ni moves to a voltage Vi-Vrix, thereby subtracting a voltage corresponding to the analog conversion of the four most significant bits of the digital output signal from the input voltage Vi. According to whether Vi-Vrix is; lower or higher than the reference voltage Vri', the voltage at the branch point Ni translates to a logic level 0 or 1 on the generic output Ui, thus resulting into a" and delete "and allows the operation"; and allows the operation fine conversion giving the 4 least significant bits of the input signal Vi.

We claim:

1. High speed analog-to-digital converter, characterized in that it comprises a plurality of comparison cells which in successive steps determine the four most significant bits of the conversion and then the four least significant bits after the more significant bits have been reconverted to analog and their subsequent subtraction from the input signal where each of said comparison cells is constituted by a comparator with input connected to an intermediate branch point between two condensers in series, one of which is supplied in a first step with an input signal, in a second step with a first reference voltage different for each cell and in a third step with a selected reference voltage equal to that of said first reference voltages which approximates said input signal downward with the highest accuracy, and by a second condenser which is grounded during said first and second step, while in the third step it is connected to one respective of a plurality of second reference voltages submultiples of said first reference voltage.

2. Converter according to claim 1, further comprising a decoding logic which detects the value of the outputs of said comparators during said second step and determines during said third step the choice of said selected reference voltage.

* * * * *